(12) United States Patent
Matsumoto et al.

(10) Patent No.: US 8,431,895 B2
(45) Date of Patent: Apr. 30, 2013

(54) PATTERN MEASURING APPARATUS AND PATTERN MEASURING METHOD

(75) Inventors: Jun Matsumoto, Tokyo (JP); Yoshiaki Ogiso, Tokyo (JP)

(73) Assignee: Advantest Corp., Tokyo (JP)

( * ) Notice: Subject to any disclaimer, the term of this patent is extended or adjusted under 35 U.S.C. 154(b) by 1 day.

(21) Appl. No.: 12/807,615

(22) Filed: Sep. 9, 2010

(65) Prior Publication Data

US 2011/0049362 A1 Mar. 3, 2011

Related U.S. Application Data

(63) Continuation of application No. PCT/JP2008/054295, filed on Mar. 10, 2008.

(51) Int. Cl.
*G01N 23/225* (2006.01)
*H01J 37/28* (2006.01)

(52) U.S. Cl.
USPC .......................... 250/307; 250/310

(58) Field of Classification Search ............... 250/307, 250/310; 382/286, 199
See application file for complete search history.

(56) References Cited

U.S. PATENT DOCUMENTS

| 4,767,926 | A  | * | 8/1988 | Murakoshi et al. | 250/310 |
| 6,326,618 | B1 | * | 12/2001 | Kane et al. | 250/307 |
| 2005/0207673 | A1 | * | 9/2005 | Takane et al. | 382/286 |
| 2005/0211897 | A1 | * | 9/2005 | Sasajima et al. | 250/307 |
| 2008/0224039 | A1 | * | 9/2008 | Nakamura et al. | 250/310 |

FOREIGN PATENT DOCUMENTS

| JP | 04-058104 | 2/1992 |
| JP | 05-296754 | 11/1993 |
| JP | 11-201919 | 7/1999 |
| JP | 2002-296761 | 10/2002 |
| JP | 2004-077422 | 3/2004 |
| JP | 2007-292732 | 11/2007 |

* cited by examiner

*Primary Examiner* — Jack Berman
*Assistant Examiner* — Eliza Osenbaugh-Stewart
(74) *Attorney, Agent, or Firm* — Muramatsu & Associates

(57) ABSTRACT

A pattern measuring apparatus includes: an electron irradiating unit for radiating an electron beam onto a sample while scanning; an image data acquiring unit for acquiring an image of a pattern on the basis of secondary electrons generated from the sample; a measurement region setting unit for setting paired measurement regions each including a pattern edge in the image; and a controlling unit for calculating a distance between pattern edges in the paired measurement regions by detecting a shape of the pattern edge. The control unit calculates edge characteristic curves by finding moving averages of edge profiles and defines the positions of peak values of the edge characteristic curves as edge positions of the patterns in the measurement regions.

12 Claims, 10 Drawing Sheets

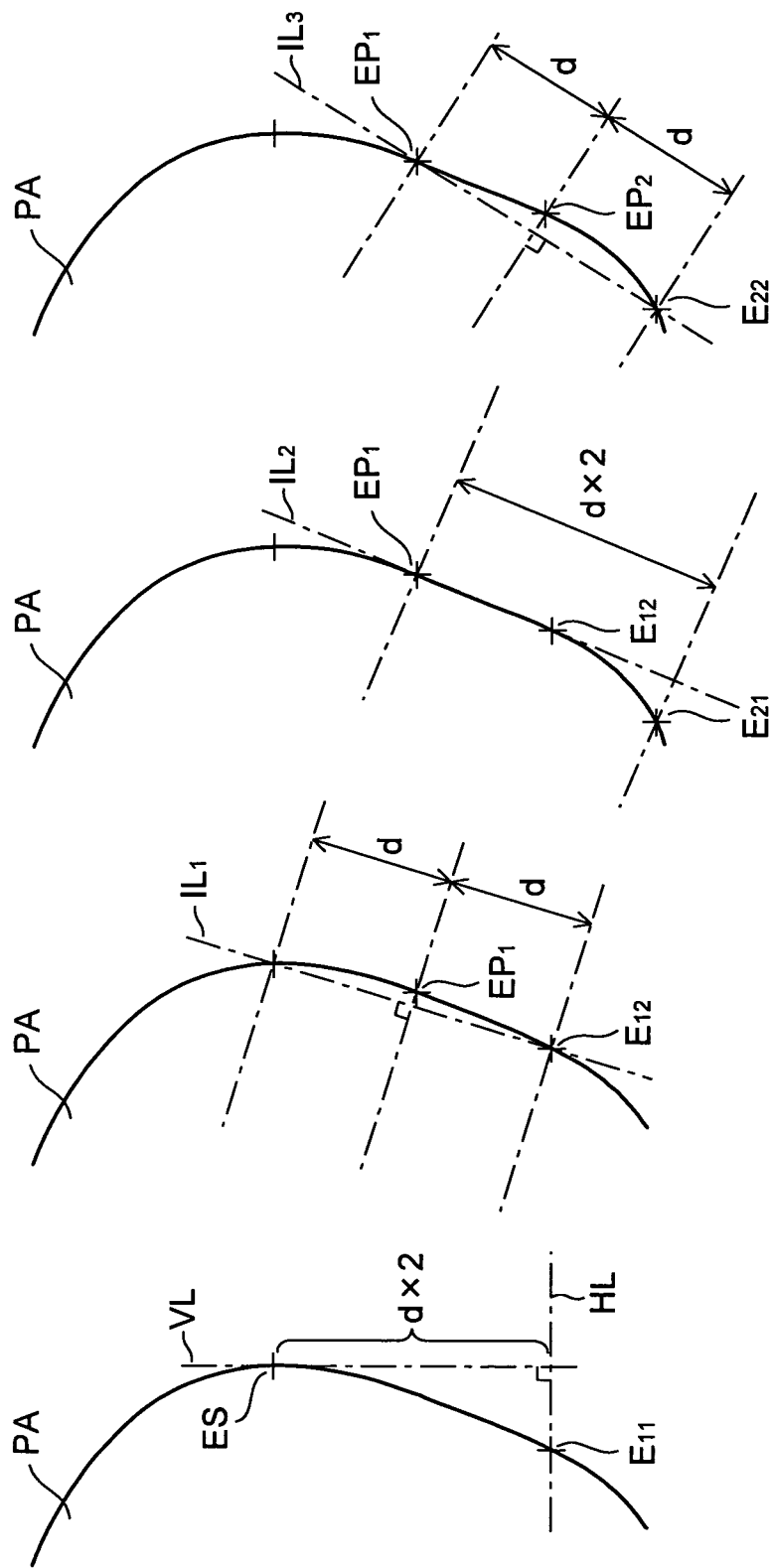

PATTERN MEASURING APPARATUS AND PATTERN MEASURING METHOD

CROSS-REFERENCE TO RELATED APPLICATIONS

This application is a continuation of prior International Patent Application No. PCT/JP2008/054295, filed Mar. 10, 2008, the entire contents of which are incorporated herein by reference.

BACKGROUND OF THE INVENTION

1. Field of the Invention

The present invention relates to a pattern measuring apparatus and a pattern measuring method which use an electron beam. In particular, the present invention relates to a pattern measuring apparatus and a pattern measuring method which are capable of measuring the distance between pattern edges with better reproducibility.

2. Description of the Prior Art

A pattern measuring method using a scanning electron microscope is employed as a method of measuring a line width of a pattern. The scanning electron microscope is configured: to radiate incident electrons while scanning the electron scanning range; to acquire secondary electrons, which are emitted from a sample, by use of a scintillator; to acquire image data by converting the amount of acquired electrons to brightness; and to display the image on a display unit.

In order to control characteristics of a semiconductor device by using such a scanning electron microscope, a generally employed practice is to check pattern formation to determine whether a line width of each line pattern and a distance between two neighboring patterns fall within ranges of design standard values. Pattern line widths and distances between patterns are controlled by use of the following procedure. To begin with, an XY stage is moved to position the scanning electron microscope on a predetermine position on patterns formed on a photomask. Thereafter, an electron beam is radiated on the patterns in a specified range which covers a position of measurement. Thus, an image representing the distribution of brightness is acquired on the basis of secondary electrons reflected from the irradiated points. Subsequently, a waveform representing the distribution of brightness is acquired from the brightness information on the measurement points. By analyzing the acquired waveform, the positions of edges of each pattern are found to determine the line width of the pattern. In addition, the distance between two edges of respective two patterns is calculated from values in the acquired image data. Subsequently, it is judged whether or not each of the line width of each pattern and the distance between the patterns fall within a range of a tolerance. The result of the judgment is used as criteria for determining whether the quality of the photomask is satisfactory or not, and as information on a process feedback for the preceding processes.

The measurement of pattern line widths and distances between patterns as described above is important for the photomask manufacturing process. Thus, various methods of measuring a line width and the like have been proposed.

In general, a position at which the brightness corresponding to the amount of secondary electrons reaches a maximum gradient is defined as the position of an edge of the pattern. In contrast, Japanese Unexamined Patent Application Publication No. Hei. 5-296754 discloses an edge detecting method in which a position at which a secondary electron signal shows a minimum value is defined as the position of an edge.

As described above, the method in which a position at which the brightness is at the maximum gradient is defined as the position of an edge, and the method in which a position at which the secondary electron signal is at the minimum value is defined as the position of an edge are employed to measure the line width of a pattern by use of a scanning electron microscope.

In such pattern edge detection, a range for edge measurement is set wider, and the position of an edge is determined by use of multiple detection values. This enables the position of the edge to be detected with better reproducibility even if a region specified as a measurement target is somewhat off the exact spot.

However, it is difficult to stably detect the position of an edge in a narrower portion of a pattern, for instance, an extreme end portion of a line pattern, because a wide measurement range cannot be used. In addition, when a region specified as a measurement target is not exactly on a desired spot, the region may or not may include a curved portion in a corner section of the pattern. This makes it difficult to detect the position of the edge with high reproducibility.

SUMMARY OF THE INVENTION

The present invention has been made in consideration of the above-described problems in the prior art. An object of the present invention is to provide a pattern measuring apparatus and a pattern measuring method which are capable of stably detecting the positions of pattern edges, and accordingly capable of measuring the distance between the pattern edges with high reproducibility and accuracy.

The problems are solved by a pattern measuring apparatus including: an electron irradiating unit for radiating an electron beam onto a sample while scanning; an image data acquiring unit for acquiring an image of a pattern on the basis of an amount of electrons generated from the sample where the pattern is formed, by the radiation of the electron beam; a measurement region setting unit for setting paired measurement regions each including a pattern edge in the image of the pattern; and a controlling unit for calculating a distance between pattern edges in the paired measurement regions by detecting a shape of the pattern edge in each measurement region, respectively, in which the control unit detects a flat portion in an edge profile of the pattern within each measurement region, the edge profile representing the pattern edge with position coordinates of each of measurement points arranged at predetermined intervals, and defines an average position of the flat portion as a position of the pattern edge in each measurement region.

In the pattern measuring apparatus according to this aspect, when no flat portion is detected, the control unit may calculate an edge characteristic curve by finding a moving average of the edge profile by use of a value obtained by subtracting a predetermined value from a design value of a width of the pattern, the predetermined value being a value by an amount of which the pattern is presumed to be curved when being formed, and the control unit may define a position of a peak value of the edge characteristic curve as a position of the pattern edge.

In the pattern measuring apparatus according to this aspect, the control unit may define y1−y2 as the distance between the edges in a y-axis direction, where: y1 denotes a y-coordinate value of the position of the pattern edge in one of the paired measurement regions; y2 denotes a y-coordinate value of the position of the pattern edge in the other of the paired measurement regions; and y1>y2. The control unit may define x2−x1 as the distance between the edges in an x-axis direction, where: x1 denotes an x-coordinate value of the position of the pattern edge within one of the paired measurement regions; x2 denotes an x-coordinate value of the position of the pattern edge within the other of the paired measurement regions; and x2-x1. The control unit may perform a smoothing process on each of the edge profiles for a predetermined number of measurement positions and detect a shortest distance between the pattern edges in the respective measurement regions by using position coordinates of each of measurement points after the smoothing process.

In the case of the present invention, the distance between the pattern edges is measured as follows. For each pattern within the specified measurement region, the flat portion is detected from the edge profile which represents the shape of the edge of the pattern with the position coordinates, and the average position of the flat portion is calculated as the edge position. One method of detecting the flat portion is that: a position at which a value of the derivative obtained by differentiating the edge profile becomes zero for the first time can be determined as the starting point of the flat portion; and a position at which the value of the thus-obtained derivative becomes zero for the last time can be determined as the end point of the flat portion. Furthermore, in the case where no flat portion can be detected, for example, because there exists no point at which the value of the derivative becomes zero, the edge characteristic curve (moving average profile) is acquired by finding the moving average of the profile by use of the width of the flat portion which is estimated on the basis of the design value of the width of the pattern. Thus, the peak position of the edge characteristic curve is determined as the edge center location. The length of the flat portion in the edge of the pattern is used as the moving average width for finding the moving average thereof. For this reason, the center location of the flat portion of the edge can be accurately obtained from the calculated edge characteristic. Subsequently, the distance between the edges of the respective patterns within the measurement regions is calculated using the edge position obtained for each pattern. This makes it possible to prevent the edge position of each pattern from differing due to deviation of the measurement region, and accordingly to calculate the distance between the edges with high reproducibility.

Another aspect of the present invention provides a pattern measuring method which is carried out in the pattern measuring apparatus according to the foregoing aspect of the present invention. A pattern measuring method according to this aspect includes the steps of acquiring images of patterns in the measurement regions; detecting edge profiles in the measurement regions, each edge profile representing a pattern edge with position coordinates of each of measurement points arranged in a predetermined interval; detecting flat portions in the edge profiles; determining positions of the pattern edges by calculating average positions of the flat portions; and detecting a distance between the paired pattern edges in the paired measurement regions.

In the pattern measuring method according to this aspect, the step of detecting the distance between the edges may be a step of defining y1-y2 as the distance between the edges in a y-axis direction, where: y1 denotes a y-coordinate value of the position of the pattern edge in one of the paired measurement regions; y2 denotes a y-coordinate value of the position of the pattern edge in the other of the paired measurement regions; and y1>y2. The step of detecting the distance between the edges may be a step of defining x2-x1 as the distance between the edges in an x-axis direction, where: x1 denotes an x-coordinate value of the position of the pattern edge within one of the paired measurement regions; x2 denotes an x-coordinate value of the position of the pattern edge within the other of the paired measurement regions; and x1<x2. The step of detecting the distance between the edges may include the steps of: smoothing the edge profile by averaging the edge profile for a predetermined number of measurement points; and detecting a shortest distance between the pattern edges in the paired measurement regions by use of position coordinates of each of the measurement points in each of the paired measurement regions.

In the pattern measuring method according to this aspect, the step of detecting the distance between the edges may be a step of defining y1-y2 as the distance between the edges in a y-axis direction, where: y1 denotes a y-coordinate value of the position of the pattern edge in one of the paired measurement regions; y2 denotes a y-coordinate value of the position of the pattern edge in the other of the paired measurement regions; and y1>y2. The step of detecting the distance between the edges may be a step of defining x2-x1 as the distance between the edges in an x-axis direction, where: x1 denotes an x-coordinate value of the position of the pattern edge within one of the paired measurement regions; x2 denotes an x-coordinate value of the position of the pattern edge within the other of the paired measurement regions; and x1>x2. The step of detecting the distance between the edges may include the steps of: smoothing the edge profile by averaging the edge profile in units of a predetermined number of measurement points; and detecting a shortest distance between the pattern edges in the paired measurement regions by use of position coordinates of each of the measurement points of the smoothed pattern edge in each of the paired measurement regions.

BRIEF DESCRIPTION OF THE DRAWINGS

FIGS. 10A to 10D are diagrams for explaining a method of detecting the positions of the edges within the ROIs.

DESCRIPTION OF THE PREFERRED EMBODIMENTS

Figure 1:
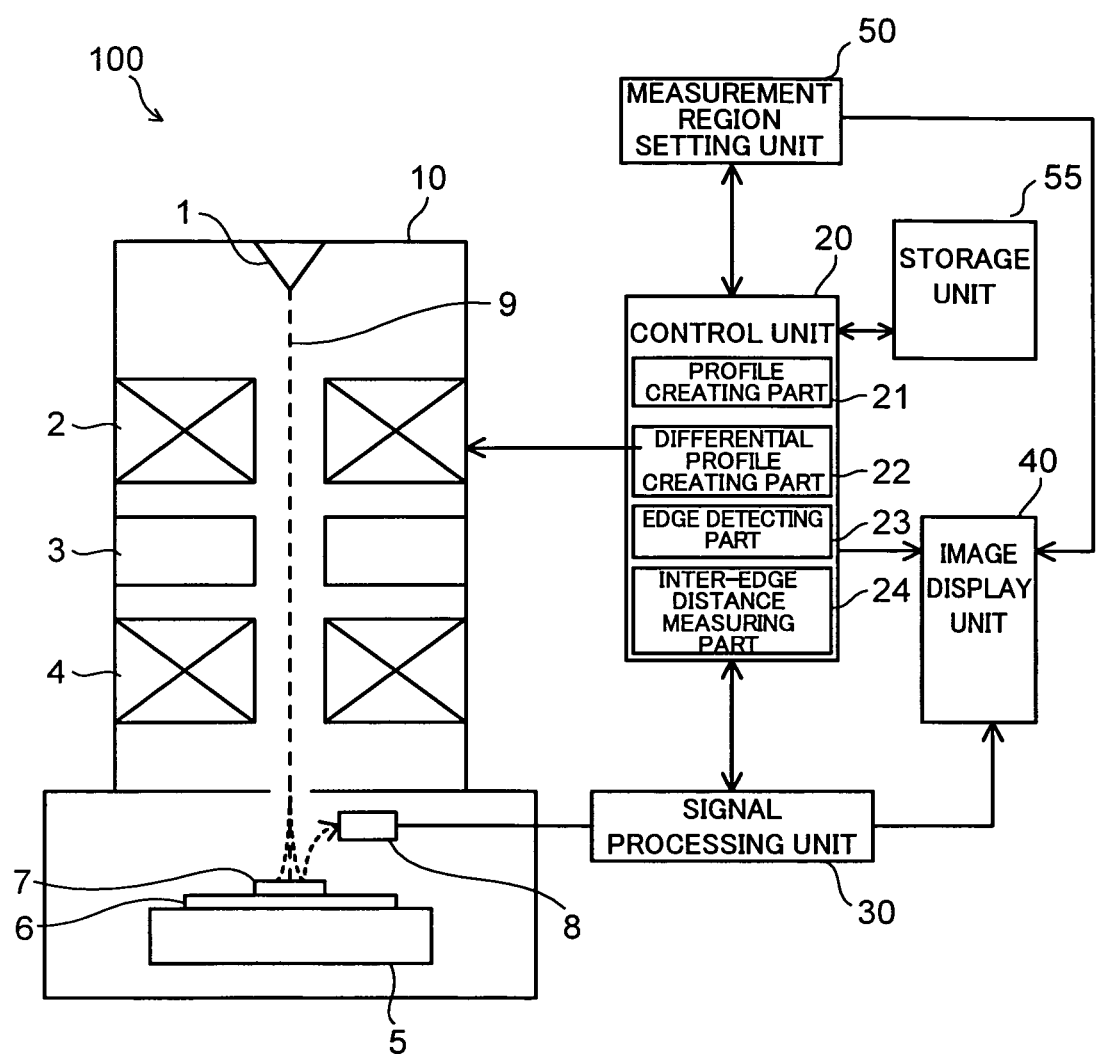
FIG. 1 is a diagram showing a configuration of a scanning electron microscope which is used for an embodiment of the present invention.

Descriptions are hereinafter provided for an embodiment of the present invention by referring to the drawings.

First of all, descriptions are presented with respect to a configuration of a scanning electron microscope which is used as a pattern measuring apparatus. Subsequently, descriptions are presented with respect to a general method of measuring a line width of a pattern. Thereafter, descriptions are presented with respect to how to measure the distance between edges of the respective patterns, including how to detect the position of each edge with better reproducibility. Finally, descriptions are presented with respect to a method of measuring the distance between the edges of the respective patterns.

(Configuration of Scanning Electron Microscope)

FIG. 1 is a diagram of a configuration of a scanning electron microscope according to the embodiment.

The scanning electron microscope 100 includes: an electron scanning unit 10; a signal processing unit 30; an image display unit 40; a measurement region setting unit 50; a storage unit 55; and a control unit 20 for controlling the electron scanning unit 10, the signal processing unit 30, the image display unit 40, the measurement region setting unit 50 and the storage unit 55. The control unit 20 includes a profile creating part 21, a differential profile creating part 22, an edge detecting part 23, and an inter-edge distance measuring part 24.

The electron scanning unit 10 includes an electron gun 1, a condenser lens 2, a deflection coil 3, an objective lens 4, a movement stage 5, and a sample holder 6.

Charged particles 9 emitted from the electron gun 1 are designed to pass through the condenser lens 2, the deflection coil 3 and the objective lens 4; and to radiate a sample 7 placed on the movement stage 5.

The charged particles 9 (primary electron beams) are radiated on the sample 7 while two-dimensionally scanned thereon. Secondary electrons ejected from the irradiated area are detected by an electron detector 8 which includes a scintillator. The amount of secondary electrons thus detected is converted to a digital amount by an analog-to-digital (AD) converter in the signal processing unit 30. The digital amount is stored in the storage unit 55 as image data. The image data is converted to brightness signals, and is thus displayed on the image display unit 40. A two-dimensional digital image is acquired from the image data by two-dimensionally arranging the image data in a way that the image data are placed in the respective positions corresponding to positions at which the primary electron beams are scanned on the sample 7. Each of the picture elements (pixels) constituting the two-dimensional digital image represents brightness data with an 8-bit information content.

The control unit 20 controls how much the electrons should be deflected by the deflection coil 3, and how much scanning should be required for an image to be displayed on the image display unit 40. A program for measuring the distance between edges is stored in the control unit 20.

The profile creating part 21 creates a line profile which represents brightness signals on a specified range of SEM image data. The line profile represents brightness signals each corresponding to an amount of secondary electrons. The line profile is considered to reflect a cross-sectional shape of a pattern to be measured.

The differential profile creating part 22 creates a first differential profile by a process of finding the first derivative of the line profile.

The edge detecting part 23 detects an edge in a pattern on the basis of the line profile and the first differential profile. In addition, as described later, the edge detecting part 23 creates an edge profile which represents the shape of the edge, and further finds a moving average of the edge profile by use of a predetermined moving average width, and hence creating a moving average profile.

The inter-edge distance measuring part 24 measures the distance between the edges of the patterns included in the paired regions of interest (ROIs) specified by the measurement region setting unit 50. The inter-edge distance measuring part 24 measures the distance between the edges of the two patterns in the x-axis direction or in the y-axis direction, and the shortest distance between the edges of the two patterns.

(General Method of Measuring Line Width of Pattern)

Figure 2A:
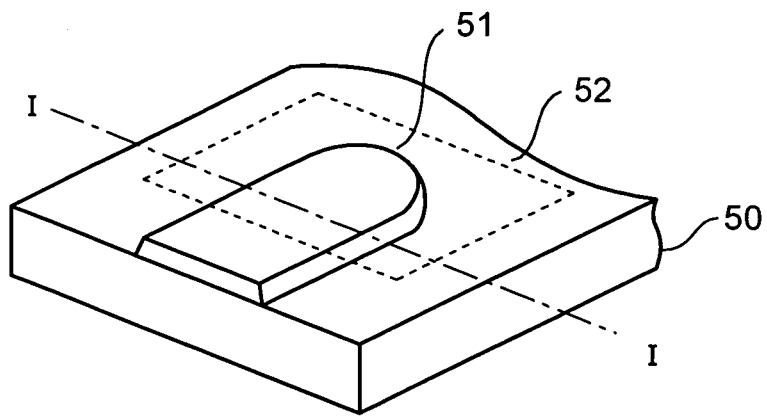
FIGS. 2A to 2D are diagrams each explaining an electron image and profiles which are acquired by a signal processing unit.

Next, descriptions are presented with respect to a general method of measuring a line width of a pattern on a sample shown in FIG. 2A by use of the scanning electron microscope 100 shown in FIG. 1.

Let us assume that a photomask substrate 50 on which an interconnection pattern 51 is formed as shown in FIG. 2A is used as the sample 7. A portion of the sample 7 is shaped flat as shown in FIG. 2A. In the drawing, an area surrounded by a broken line 52 is shown as a region to be observed with the scanning electron microscope 100.

Figure 2B:
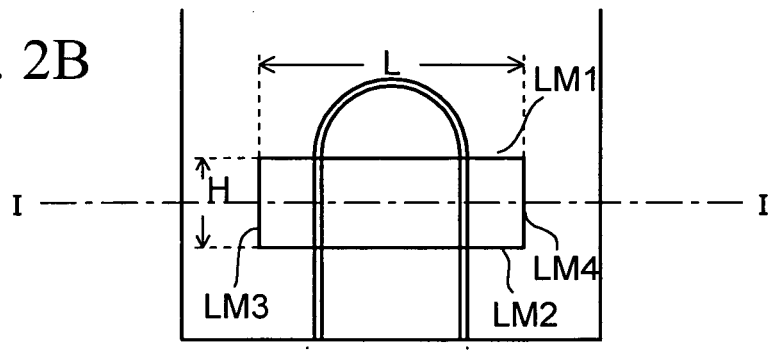

FIG. 2B shows an example of an SEM image which is displayed by: causing the electron detector 8 to detect the amounts of secondary electrons and the like which are obtained by scanning electron beams on the sample shown in FIG. 2A; converting the thus-detected amounts of electrons to brightness signals; and synchronizing the electron beam scans and the cathode ray tube (CRT) scans of the display unit.

An SEM image is extracted from the SEM image shown in FIG. 2B by specifying an area for measurement. The area for measurement has a width H of 400 pixels and a length L, for instance. An operator selects this area by use of an upper line marker LM1, a lower line marker LM2, a left line marker LM3 and a right line marker LM4.

The area for measurement is divided into sub-areas which are arranged one after another in a direction indicated by a reference sign H. For each sub-area, a line profile corresponding to brightness distribution is found from pixel data on the extracted SEM image. Note that when finding any line profile, noise components can be reduced by applying, for instance, a 3-pixel-wide smoothing process to the corresponding piece of the pixel data on the extracted SEM image in a direction of the length L.

Figure 2C:
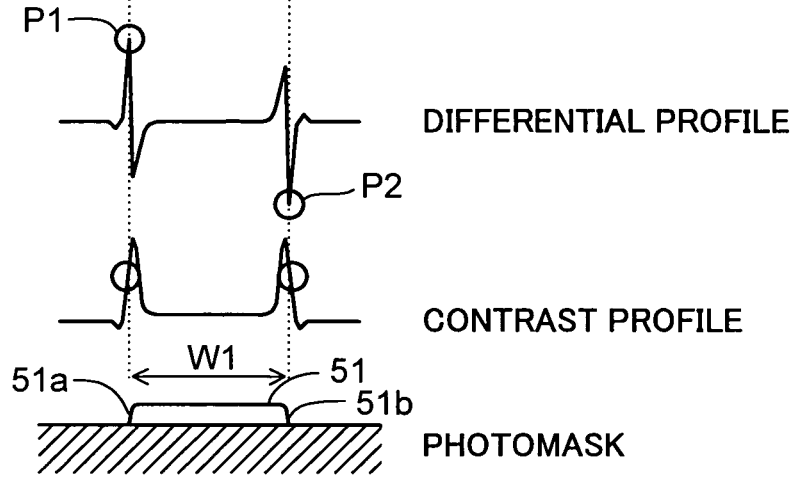

FIG. 2C is a diagram showing a line profile which corresponds to an amount of secondary electrons emitted from the sample, which is acquired when an electron beam is radiated on the sample along the I-I line of FIG. 2A. As shown in FIG. 2C, the line profile (contrast profile) abruptly changes in edge portions of the pattern. For the purpose of finding positions at which the line profile abruptly changes, the line profile is differentiated, and the maximum and minimum peaks of the amount of differentiated signal are found.

Figure 2D:
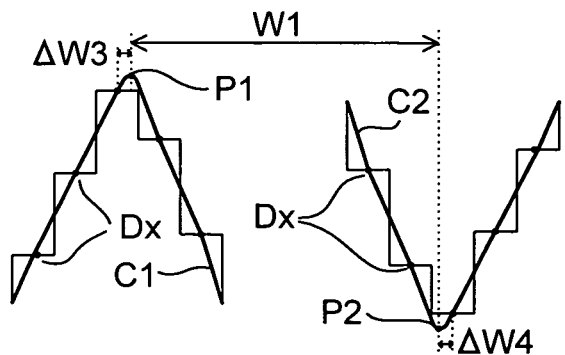

Subsequently, as shown in FIG. 2D, each of differential waveforms C1, C2 is found by interpolating pixels on the basis of multiple differentiated signals Dx before and after the corresponding peak. Thus, peak positions of the respective first and second peaks P1, P2 are calculated with a 1/100 resolution. The width W1 of the line pattern is found as the distance between the first peak P1 and the second peak P2.

A more precise width W1 of the line pattern can be obtained by: applying the foregoing process to all of the divided sub-areas; calculating the widths of the pattern for the respective sub-areas; and defining an average of the thus-calculated widths of the pattern as the measurement value.

(Measuring Distance Between Edges of Pattern)

The general method of measuring the distance between edges of a pattern, which has been described above, aims at finding a precise distance between the edges thereof by setting measurement region wide. The present embodiment enables the distance between edges to be precisely measured even in a case where no wide measurement region can be set up.

Figure 3A:
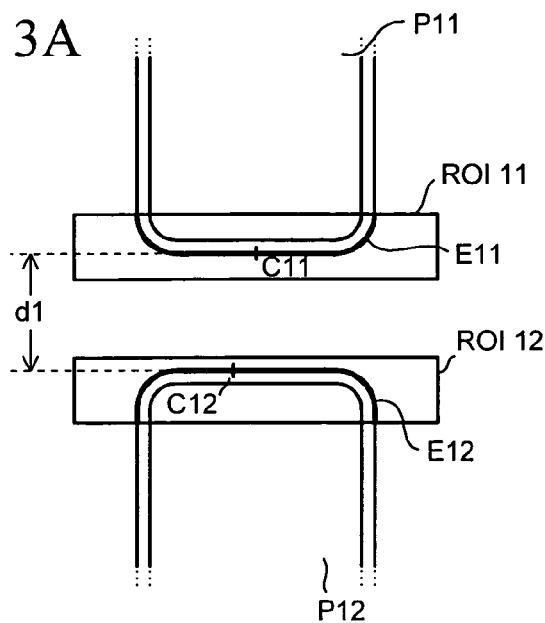
FIGS. 3A to 3C are diagrams each explaining patterns to be measured and regions of interest (ROIs) used to specify the respective measurement regions.
Figure 3B:
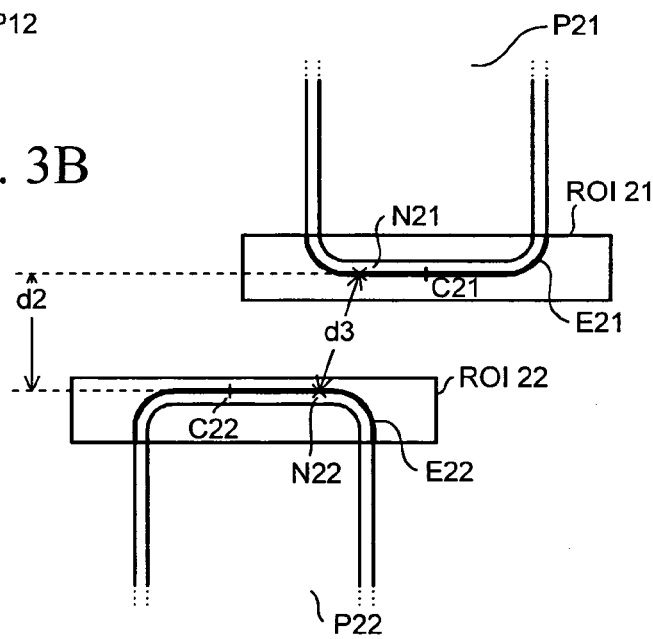
Figure 3C:
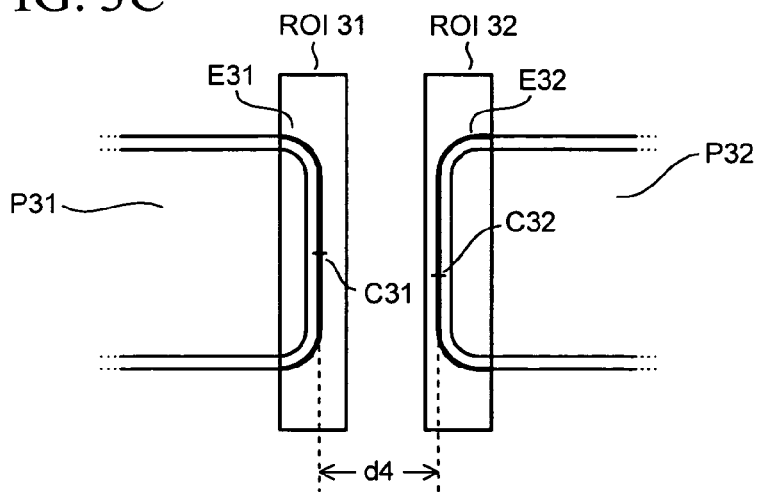

FIGS. 3A to 3C are diagrams each showing an example of how to measure the distance between edges of the respective patterns. FIGS. 3A to 3C each shows a portion of an SEM image of patterns formed on a sample. In FIGS. 3A to 3C, the vertical direction is defined as the y-axis direction, and the left-right direction is defined as the x-axis direction. For instance, FIG. 3A shows patterns P11, P12 which are opposite to each other in the y-axis direction. FIG. 3A shows how to measure the distance between edges of these patterns by specifying measurement regions by use of ROI boxes (ROI11, ROI12), respectively. In addition, FIG. 3B shows patterns P21, P22 which are opposite to each other in the y-axis direction, and which are shifted to each other in the x-axis direction. Furthermore, FIG. 3C shows patterns P31, P32 which are opposite to each other in the x-axis direction.

As shown in FIG. 3A, in a case where the distance between extreme end portions of the respective two patterns is measured, data covering a wide range cannot be acquired from either of the two patterns because the length of the flat portion of each pattern is too short. This makes it difficult to measure the distance between the extreme end portions of the respective two patterns precisely. In addition, in the case where the flat portion of each pattern is short as in this case, even a slight deviation of the corresponding ROI box causes some boundary of the ROI box to overlap part of a corner of the pattern. If the corner thereof is so curved as to deviate from its design value, a value representing the position of the edge may vary depending on whether or not the boundary of the ROI box overlaps the curved portion. As a result, the detected distance between the two edges differs each time the measurement is made. This reduces the reproducibility of detection of the distance between the edges.

In this respect, for the purpose of detecting the position of an edge portion accurately, the inventors of the present invention have developed an idea of using the shape of the edge portion. Specifically, the inventors have paid attention to the fact that, when a flat portion to be measured and the shapes of the respective two ends of the flat portion are analyzed, it is possible to accurately find a range of the flat portion or a center location of the flat portion.

In the case of the present embodiment, as shown in FIG. 3A, for instance, the measurement regions (ROI11, ROI12) are specified so that the curved portions of the respective corners are included in the measurement regions. Descriptions are hereinbelow presented with respect to how a range of a flat portion as a measurement target, or a center location of the flat portion, is accurately calculated from an edge profile of a pattern within a measurement region (which is referred to as an ROI box as well) set up as described above.

Figure 4:
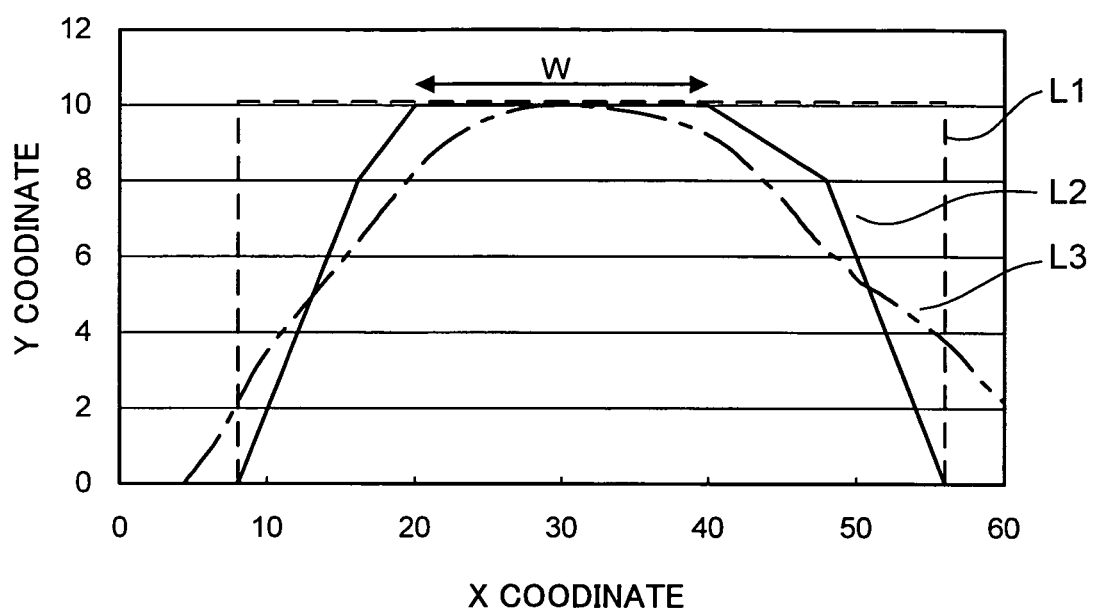
FIG. 4 is a diagram for explaining a relationship between the shape of an edge and a moving average profile.

FIG. 4 is a diagram showing an example in an end portion of a pattern. In FIG. 4, the broken line L1 indicates a design value, and the continuous line L2 indicates an edge profile of a formed pattern. As shown in FIG. 4, no pattern is actually formed in conformity with the design value. In particular, the corner tends to be more rounded.

Thus, in the present invention, a differential profile is created by finding the derivative of the profile of the edge shape represented by the continuous line L2. A position at which the value of the derivative thereof becomes zero for the first time is defined as a starting point of the flat portion. A position at which the value of the derivative thereof becomes zero for the last time is defined as an end point of the flat portion. Thereby, the distance between these two positions can be found as the range of the flat portion.

In the present embodiment, a position obtained by averaging the thus-found ranges of the flat portion is defined as the position of an edge. In addition, in a case where no flat portion is detected, the length of a portion which can be presumed flat in an edge of the pattern is set as a moving average width, and the moving average of the edge profile is found by use of this moving average width. Thereby, a moving average profile is created. In this respect, the length of the portion which can be presumed flat in the edge of the pattern is defined as a value obtained by subtracting a length of a portion of each corner, which is presumed to be a curved shape when the pattern is formed, from the designed value of the edge. For instance, the length of each portion which is presumed to be a curved shape is estimated at 50 nm regardless of the length of the edge.

The edge profile represents the shape of the edge by indicating the edge with the position coordinates of each of the measurement points which are located at predetermined intervals. The moving average process is carried out at all of the measurement points of the edge profile. Specifically, let us assume a case where: the moving average width is calculated at 100 nm, for instance; and the number of measurement points of the edge profile is 36 for the 100 nm. In this case, each time the moving average width is shifted forward by one measurement point of the edge profile, an average of the position coordinates of a series of 36 measurement points of the edge profile is obtained.

As shown in FIG. 4, the result of finding the moving average of the edge profile indicates that the moving average profile L3 has a peak value and the position of the peak value corresponds to the center of the flat portion of the edge. This position is hereinafter referred to as a "center edge position" in the edge of the pattern within the measurement region.

Note that, when the moving average width is set at an optimal value, i.e., when the moving average width is equal to the width of the flat portion of the edge within the measurement region, the alignment position and the average position can be calculated simultaneously. However, it is difficult to exactly estimate the length of the curved portion of each corner in the pattern, and it is accordingly difficult to set the moving average width at an optimal value.

Figure 5A:
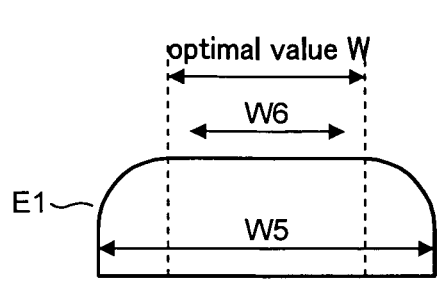
FIGS. 5A to 5D are diagrams each explaining accuracy with which the position of an edge is detected depending on a value representing a moving average width.
Figure 5B:
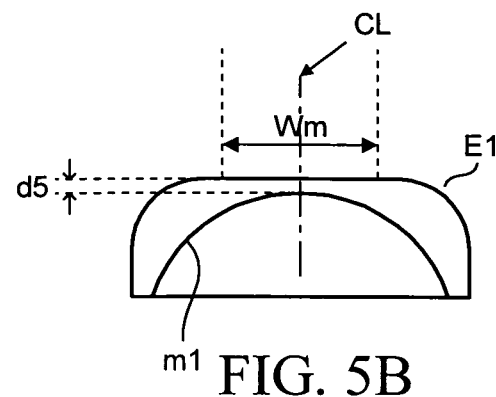

Descriptions are presented with respect to precision with which the position of the edge is detected depending on the value of the moving average width by referring to FIGS. 5A to 5D. FIG. 5A shows an example of a pattern whose width in the x direction is denoted by a reference sign W5. The length of the flat portion of the edge in this pattern is equal to a length obtained by subtracting the length of the curved portion of each corner in the pattern from the width of the pattern in the x direction, and is an optimal moving average width W. FIG. 5B shows a moving average profile m1 overlapping the edge profile E1 shown in FIG. 5A. In this respect, the moving average profile m1 is acquired by calculating a moving average of the edge profile E1 by use of a moving average width W5 which is larger than the optimal moving average width W. As shown in FIG. 5B, although the moving average profile m1 has a peak value, the y-coordinate value of the moving average profile m1 is different from the y-coordinate value of the actual edge, and the difference d5 occurs. Namely, an error occurs in the coordinate values (x, y) (referred to as an "average position" as well) of the center location of the edge. This makes the average position less accurate.

Figure 5C:
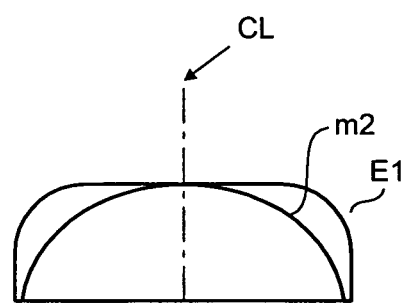

FIG. 5C shows a moving average profile m2 which is acquired by calculating a moving average of the edge profile E1 with the optimal moving average width W. In this case, the position of the peak of the moving average profile m2 matches the center of the edge.

Figure 5D:
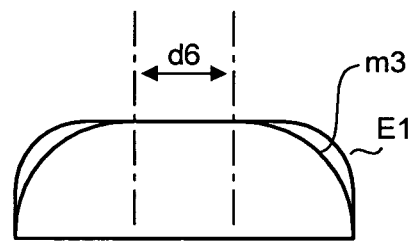

On the other hand, FIG. 5D shows a moving average profile m2 which is acquired by calculating a moving average of the edge profile E1 with a moving average width W6 which is narrower than the optimal moving average width W. In this case, the moving average profile m3 has no peak value, but has a flat portion with a width d6 whose y-coordinate value is constant. For this reason, it is impossible to uniformly determine the x-coordinate value (referred to as an "alignment position" as well) of the edge. This makes the alignment position less accurate.

Even in a case where the moving average width is not set at an optimal value, the alignment position and the average position can be calculated accurately by performing the calculation of the alignment position and the calculation of the average position separately as follows.

First of all, the moving average width is set at the value W5 which is larger than the optimal value W, and a moving average of the edge profile is calculated with the moving average width W5. This moving average width W5 is set equal to the width of the pattern, for instance. By this, the alignment position, that is to say, the center location CL of the flat portion of the edge is calculated accurately.

Subsequently, an average value of y-coordinate values of the edge profile E1 is obtained, the y-coordinate values in a range between minus Wm/2 and plus Wm/2 with respect to x-coordinate value (center location CL) found by the calculation of the alignment position (see FIG. 5B). Note that Wm is a value which is selected with consideration of a variation in the width of the flat portion in the actual SEM image. It is desirable that the Wm is closer to the optimal value W. By this, the coordinate values (x, y) of the average position are calculated.

The forgoing descriptions have been presented with respect to how to measure the distance between the edges of the patterns within the measurement regions, respectively, in the case where the paired edges are shaped like the outward curve. The shapes of the edges as the measurement objects are not limited to the outward curve. The shapes thereof may include an inward curve and a flat shape as well. With this taken into consideration, descriptions are presented with respect to how to detect the position of an edge depending on the shape of the edge.

Figure 6A:
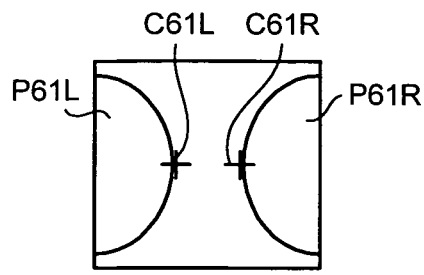
FIGS. 6A to 6H are diagrams each showing an example of the shapes of the respective edges which are opposite to each other.
Figure 6B:
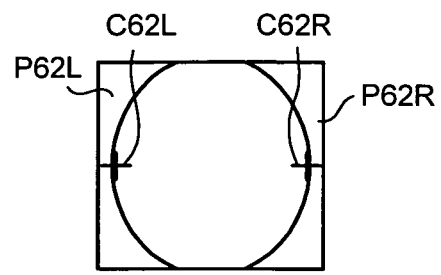
Figure 6C:
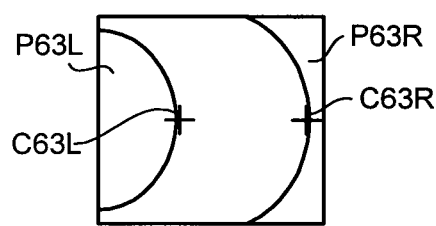
Figure 6D:
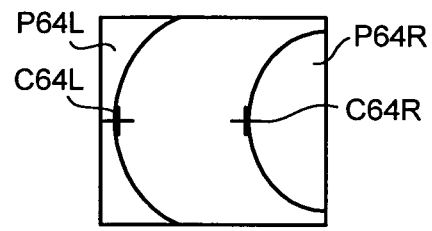
Figure 6E:
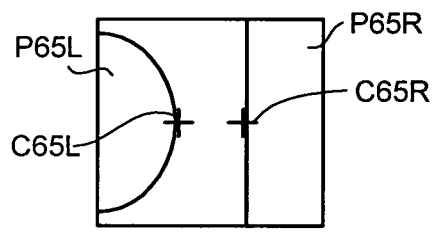
Figure 6F:
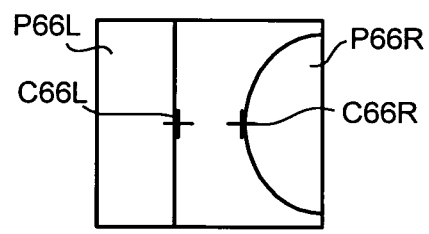
Figure 6G:
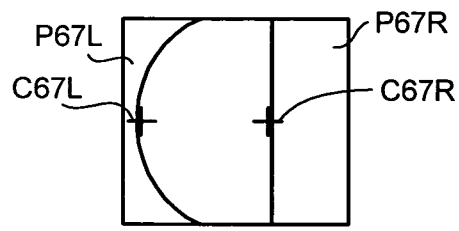
Figure 6H:
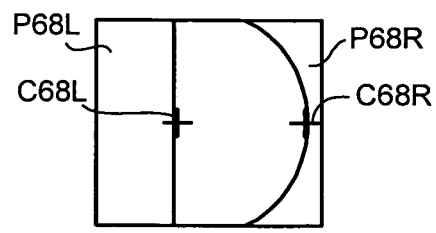

FIGS. 6A to 6H each show an example of the shapes of edges opposite to each other. FIG. 6A shows left and right patterns P61L, P61R whose respective extreme end portions are shaped like an outward curve. FIG. 6B shows left and right patterns P62L, P62R whose extreme end portions are shaped like an inward curve. FIGS. 6C and 6D each show left and right patterns (P63L, P63R; P64L, P64R), one of which has an extreme end portion shaped like an outward curve, and the other of which has an extreme end portion shaped like an inward curve. FIGS. 6E and 6F each show left and right patterns (P65L, P65R; P66L, P66R), one of which has an extreme end portion shaped like an outward curve, and the other of which is flat. FIGS. 6G and 6H each show left and right patterns (P67L, P67R; P68L, P68R), one of which has an extreme end portion shaped like an inward curve, and the other of which is flat.

FIGS. 6A to 6H each showing an example of the shapes of edges opposite to each other. FIG. 6A shows left and right patterns P61L, P61R whose respective extreme end portions are shaped like an outward curve. FIG. 6B shows left and right patterns P62L, P62R whose extreme end portions are shaped like an inward curve. FIGS. 6C and 6D each showing left and right patterns (P63L, P63R; P64L, P64R), one of which has an extreme end portion shaped like an outward curve, and the other has an extreme end portion shaped like an inward curve. FIGS. 6E and 6F each showing left and right patterns (P65L, P65R; P66L, P66R), one of which has an extreme end portion shaped like an outward curve, and the other is flat. FIGS. 6G and 6H each showing left and right patterns (P67L, P67R; P68L, P68R), one of which has an extreme end portion shaped like an inward curve, and the other is flat.

In the case where an edge is shaped like a straight line similar to the edge of the right pattern P65R in FIG. 6E, no peak value can be obtained even if the moving average of the edge profile is found. For this reason, the detection of the center edge position by use of a peak value of a moving average profile cannot be achieved. In this case, the position coordinates of the center edge position of the outward-curved edge which is opposite to the edge shaped like the straight line is used to detect the center edge position of the edge shaped like the straight line. For instance, let us assume that in FIG. 6E, the coordinates C65L of the center edge position of the left pattern P65L is (x1, y1), and the x coordinate of the right pattern P65R is x2. In this case, the coordinates C65R of the center edge position of the right edge shaped like the straight line is set at (x2, y1). Similarly, the center edge position of the edge shaped like the straight line in each of FIGS. 6F to 6H is detected.

Figure 7:
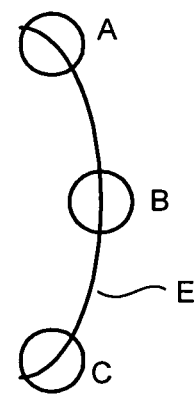
FIG. 7 is a diagram for explaining how to determine the shape of an edge.

The shape of an edge is determined as follows. FIG. 7 shows a portion of an edge E within a measurement region. As shown in FIG. 7, the edge positions detected by dividing the whole of the edge E into 3 parts are defined as A (xa, ya), B (xb, yb) and C (xc, yc). For instance, when judging whether the edge curves inward or outward in the x-axis direction, if xa<xc<xb or xc<xa<xb, the edge is judged as curving outward in the +x direction. If xb<xa<xc or xb<xc<xa, the edge is judged as curving outward in the −x direction. In any other case, the edge is judged as being shaped like a straight line.

For each of the specified paired edges, its shape is judged as described above, and its edge profile is calculated. Further, a moving average profile representing the edge characteristic is created. Thus, the edge position is detected accurately.

As described above, in the case where the distance between edges is measured, if the lengths of the edges are short because the edges are situated in extreme end portions of line patterns, the extreme end portions are specified as measurement regions at first. Subsequently, for each of the edges of the patterns within the measurement regions, the edge profile representing the shape of the edge is created with position coordinates. Afterward, the flat portion is detected from this edge profile, and the average position of the flat portion is calculated as the edge position. One method of detecting the flat portion is that: a position at which a value of the derivative obtained by differentiating the edge profile becomes zero for the first time can be determined as the starting point of the flat portion and a position at which the value of the derivative becomes zero for the last time can be determined as the end point of the flat portion. Furthermore, in the case where no flat portion can be detected, for example, because there exists no point at which the value of the derivative becomes zero, the edge characteristic curve (moving average profile) is acquired by finding the moving average of the profile with the width of the flat portion which is estimated on the basis of the design value of the width of the pattern. Thus, the peak position of the edge characteristic curve is determined as the edge center location. The edge center location is calculated for each of the patterns within the specified paired measurement regions and the distance between the edge center locations is obtained as the distance between the edges. This makes it possible to prevent the edge position of each pattern from differing due to deviation of the corresponding measurement region, and accordingly to calculate the distance between the edges with high reproducibility.

(Method of Measuring Distance Between Edges of Patterns)

Figure 8:
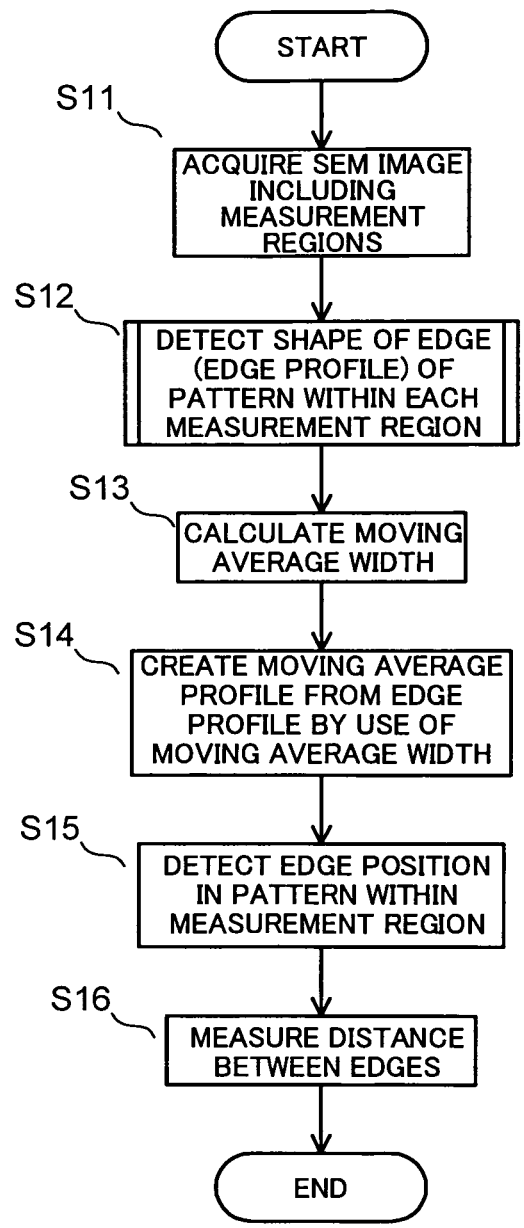
FIG. 8 is a flowchart showing an example of a process for calculating the distance between edges.

Next, descriptions are presented with respect to a process of measuring the distance between edges by referring to a flowchart shown in FIG. 8. The following descriptions for the process of measuring the distance between edges is made on the assumption that the positions of two edges as measurement objects are specified by use of the paired ROI boxes (or as measurement regions), respectively. The specification using the ROI boxes is achieved in a way that: the ROI boxes include the edges as the objects, respectively; and each ROI box is large enough to include the corresponding edge even if the ROI box is not set in the exact spot.

First of all, in step S11, an SEM image which includes the measurement regions specified by use of the ROI boxes is acquired. Data on this SEM image is extracted from the storage unit 55 in which the data on the SEM image is stored as pixel data.

In the ensuing step S12, the shape of the edge (edge profile) of each of the patterns within the measurement regions is detected. This shape of the edge is expressed with a series of position coordinates.

Figure 9:
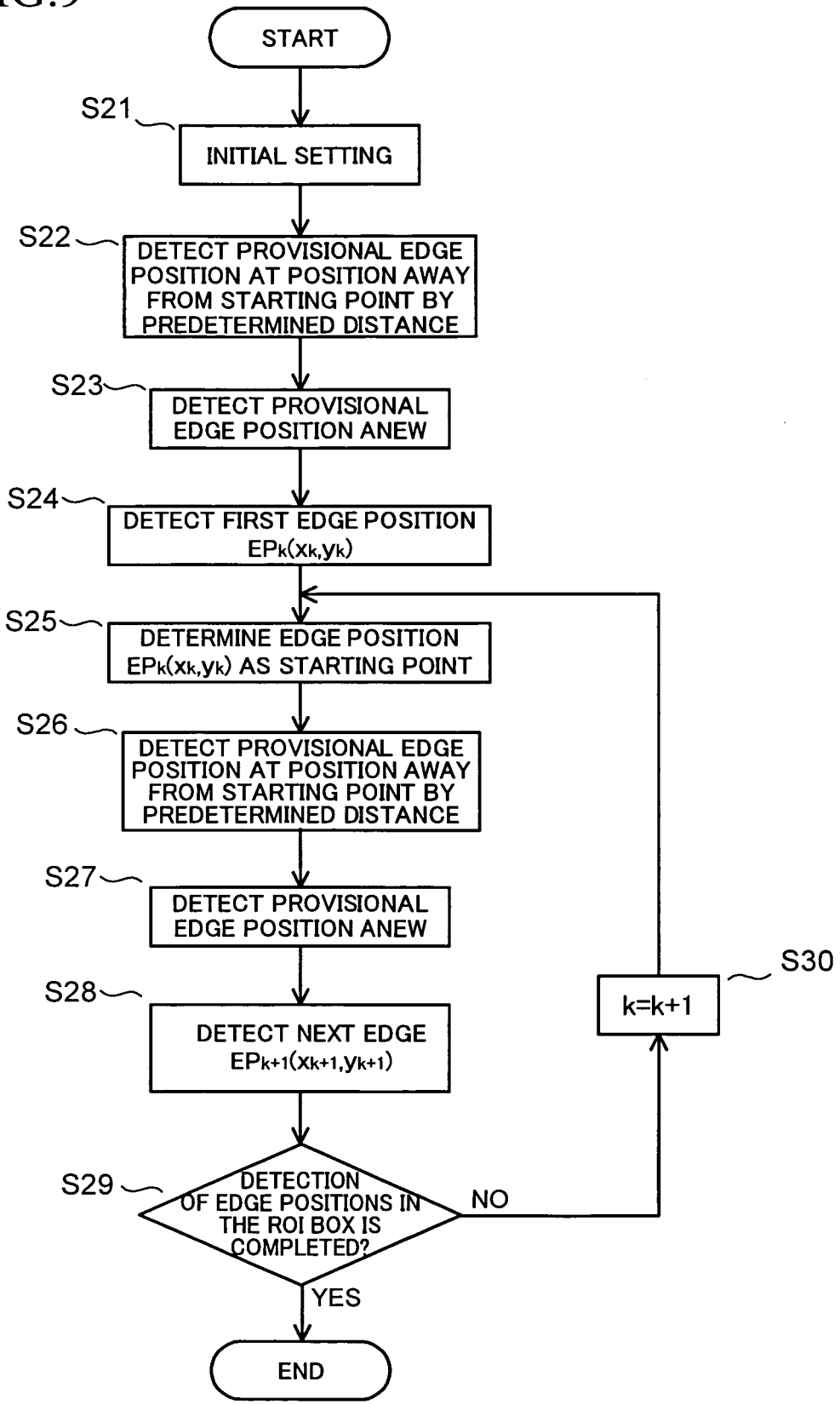
FIG. 9 is a flowchart showing an example of a process for detecting the positions of edges of patterns within ROIs.

Descriptions are presented with respect to a process of detecting the shape of the edge of the pattern within each measurement region by referring to FIGS. 9 and 10. FIG. 9 is a flowchart showing how to carry out a process of detecting the edge profile within each measurement region. FIG. 10 is a diagram showing how to detect the edge profile within each measurement region. Note that: the process of detecting the edge profile handles the edge of the pattern within the measurement region as the object; and the starting point of the detection of the edge profile is a point on the edge at which the corresponding ROI box and the pattern intersect each other.

To begin with, in step S21, initial settings are performed. As one of the initial settings, a predetermined interval (hereinafter referred to as "a specification step") used to detect the edge within the region defined by the ROI box is specified. For example, this specification step sets a distance corresponding to a predetermined number of pixels. In addition, a counter k indicating the position of the edge to be detected within the region specified by the ROI box is set to 0 (zero).

In the ensuing steps S22 to S24, an edge position which is away from the starting point ES by a predetermined number of the specification step d is detected.

In step S22, a provisional edge is detected at a position which is away from the starting point ES by the distance corresponding to two specification step d (i.e., d×2). To be more precise, as shown in FIG. 10A, a straight line extending downward (in the −y direction) from the starting point ES is defined as a straight line VL, and a line HL orthogonally crossing the straight line VL at a position which is away from the starting point ES by the distance corresponding to two specification step d is defined as a reference line used to create the profile. The line profile is created by use of this reference line HL, and an edge $E_{11}$ is detected as shown in FIG. 10A. This detected edge $E_{11}$ is defined as a provisionally-detected edge $E_{11}$.

In the subsequent step S23, the provisionally-detected edge $E_{11}$ detected in step S22 is detected anew. A line orthogonally crossing a straight line, which joins the starting point ES and the provisionally-detected edge $E_{11}$, at a position which is away from the starting point ES by the distance corresponding to the two specification step d on the straight line is defined as a reference line used to create the profile. A line profile on this reference line is obtained. A provisionally-detected edge position is detected anew. The detection of the provisionally-detected edge position in the different way aims at approximating the distance from the starting point ES to the distance corresponding to the two specification step d.

In the following step S24, the first edge position is detected. A line profile is obtained on a line orthogonally crossing a straight line $IL_1$, which join the starting point ES and the provisionally-detected edge position $E_{12}$ thus detected anew, at a middle position $MP_1$. Thus, an edge $EP_k$ ($x_k$, $y_k$) is detected. In FIG. 10B, an edge $EP_1$ is detected as the first edge.

In the ensuing step S25, the edge $EP_k$ ($x_k$, $y_k$) is used as the starting point for detecting the next edge. In FIG. 10C, the edge $EP_1$ is used as the starting point.

In the subsequent steps S26 to S28, an edge position $EP_{k+1}$ ($x_{k+1}$, $y_{k+1}$) which is away from the starting edge position $EP_k$ ($x_k$, $y_k$) by the predetermined number of specification step d is detected.

In step S26, a line orthogonally crossing a straight line $IL_2$, which joins the starting point $EP_1$ and the provisionally-detected edge $E_{12}$ thus detected anew, at a position which is away from the starting point $EP_1$ by the distance corresponding to the two specification step d on the straight line $IL_2$ is defined as a reference line used to create the profile. A line profile is obtained by use of this reference line. Thus, an edge is detected. This detected edge is defined as a provisionally-detected edge $E_{21}$.

Like in step S24, in step S27, a line orthogonally crossing a straight line, which joins the starting point $EP_1$ and the provisionally-detected edge position $EP_{21}$, at a position which is away from the starting point $EP_1$ by the distance corresponding to the two specification step d on the straight line is defined as a reference line used to create the profile. A line profile on this reference line is obtained. Thereby, a provisionally-detected edge position is detected anew.

In the following step S28, a line profile is obtained on a line orthogonally crossing a straight line $IL_3$, which join the starting point $EP_1$ and the provisionally-detected edge position $EP_{22}$ thus detected anew, at a middle position $MP_2$. Thus, the edge $EP_{k+1}$ is detected. In FIG. 10D, an edge $EP_2$ is detected as the second edge.

In the ensuing step S29, it is judged whether or not all the edge in the ROI box has been detected. Once it is determined that all the edge around the pattern has been detected, this process is terminated. If it is determined that the detection has not been completed yet, the process proceeds to step S30.

In the subsequent step S30, the counter is incremented as k=k+1. Thereafter, the process proceeds to step S25, where the next edge position starts to be detected.

Through the foregoing process of detecting the shape of the edge, the edge positions within each measurement region are detected, and the edge profile is created.

Afterward, in step S13 in FIG. 8, the moving average width to find the moving average of the edge profile created in step S12 is calculated. The moving average width is equal to the length of the flat portion in the edge of the pattern. The moving average width is found by use of the points at which the value of the derivative obtained by differentiating the edge profile becomes zero for the first time and for the last time. If no point at which the value of the derivative becomes zero is detected, the moving average width is set equal to the length obtained by subtracting the predetermined value, for instance, 100 nm, from the design value of the width of the pattern. The reason of using the predetermined value is based on the assumption that the length of the flat portion is always shorter than the design value thereof because the actually-formed corners of the pattern are not shaped at a right angle.

In the subsequent step S14, the moving average process is carried out on the edge profile detected in step S12 to calculate the moving average profile. This moving average process is achieved by finding the moving average of the edge profile with the moving average width calculated in step S13. Specifically, for each measurement point in the edge profile, the average of the edge profile is calculated corresponding to the moving average width.

In the following step S15, the edge position (the center edge position) is detected within the measurement region on the basis of the moving average profile. If the moving average width is equal to the width of the flat portion of the edge of the actual pattern, the peak value of the moving average profile represents the center location of the flat portion of the edge within the region specified by use of the ROI box. For this reason, the location is defined as the center edge position.

In the next step S16, the distance between the edges is calculated by use of the center edge positions calculated for the edges within the respective measurement regions.

Hereinbelow, descriptions are presented with respect to how to calculate the distance between the edges by referring to FIGS. 3A to 3C. Here, (a) how to calculate the distance between two patterns in the y-axis direction, (b) how to calculate the distance between two patterns in the x-axis direction, and (c) how to calculate the shortest distance between two patterns are described for this purpose.

(a) How to Calculate the Distance Between Two Patterns in the Y-Axis Direction:

For the purpose of calculating the distance in the y-axis direction between the patterns shown in FIG. 3A, the paired ROI boxes (ROI11, ROI12) are set as shown in FIG. 3A. Let us assume that through the process up to step S16, the position coordinates of the peak value of the moving average profile of the edge E11 within the ROI box ROI12 is calculated as C12 (x12, y12), while the position coordinates of the peak value of the moving average profile of the edge E11 within the ROI box ROI11 is calculated as C11 (x11, y11). In this case, the y coordinate y11 of C11 is the minimum value of the edge E11, while the y coordinate y12 of C12 is the maximum value of the edge E12. Accordingly, the distance d1 between the two edges in the y-axis direction is calculated by y11−y12.

(b) How to Calculate the Distance Between Two Patterns in the X-Axis Direction:

For the purpose of calculating the distance in the x-axis direction between the patterns shown in FIG. 3C, the paired ROI boxes (ROI31, ROI32) are set as shown in FIG. 3C. Let us assume that through the process up to step S16, the position coordinates of the peak value of the moving average profile of the edge E31 within the ROI box ROI31 is calculated as C31 (x31, y31), while the position coordinates of the peak value of the moving average profile of the edge E32 within the ROI box ROI32 is calculated as C32 (x32, y32). In this case, the x coordinate x31 of C31 is the minimum value of the edge E31, while the y coordinate x32 of C32 is the maximum value of the edge E32. Accordingly, the distance d4 between the two edges in the x-axis direction is calculated by x32−x31.

(c) How to Calculate the Shortest Distance Between Two Patterns:

Descriptions are hereinbelow presented with respect to how to calculate the shortest distance between edges. FIG. 3B shows the two patterns (P21, P22) which are formed next to each other, and which are shifted in the x-axis direction. The distance d2 between these two patterns P21, P22 in the y-axis direction is calculated by the method of the present invention which is applied to the case (a).

In this respect, descriptions are presented as to how to calculate the shortest distance between patterns. First of all, the edge profile of the pattern within each of the paired measurement regions (ROI21, R0122) is smoothed at each of the predetermined number of measurement points. The smoothing process is achieved by averaging, for instance, every three neighboring position coordinates of the edge profile. Thereby, the position coordinates (smoothed profile) representing the shape of the edge whose noise is reduced are calculated.

After the smoothing process, the distance $\sqrt{((x_j-x_i)^2+(y_j-y_1)^2)}$ between a measurement point $(x_i, y_i)$ within the ROI box ROI21 and a measurement point $(x_j, y_j)$ within the ROI box ROI22 is calculated at every measurement points. Thus, the smallest value of the distance and the position coordinates, which makes the distance have the smallest value, are obtained. For instance, if the distance between an edge position N21 $(x_{21}, y_{21})$ within the ROI box ROI21 and an edge position N22 $(x_{22}, y_{22})$ within the ROI box ROI22 has the smallest value, the shortest distance d3 between the two edges is calculated as $\sqrt{((x_{21}-x_{22})^2+(y_{21}-y_{22})^2)}$.

As described above, in the pattern measuring method according to this embodiment, for the purpose of determining the edge position of each pattern specified by the corresponding ROI box, the edge characteristic is calculated by finding the moving average of the edge profile for representing the shape of the edge specified by the series of position coordinates. This edge characteristic accurately indicates the center location of the flat portion of the edge. In addition, the distance between the edges of the patterns specified by the paired ROI boxes is calculated by use of their center locations, respectively. This makes it possible to calculate the distance between the edges with high reproducibility.

The embodiment has been described as that in which the distance between the edges of the patterns is detected in the case where the patterns are formed on a substrate made of glass or the like. However, the present invention is not limited to this case. The present invention can be applied to patterns formed in a substrate made of glass or the like by cutting the substrate.

Moreover, the embodiment has been described as that in which the distance between the edges of the respective two patterns is detected. However, the present invention is not limited to this case. The present invention can be applied to detection of the distance between edges within one pattern.

What is claimed is:

1. A pattern measuring apparatus comprising:
an electron irradiating unit which irradiates an electron beam onto a sample while scanning;
an image data acquiring unit which acquires an image of a pattern on the basis of an amount of electrons generated from the sample where the pattern is formed, by the radiation of the electron beam;
a measurement region setting unit which sets paired measurement regions each including a pattern edge in the image of the pattern; and
a control unit which controls an overall operation of the pattern measuring apparatus, the control unit calculating a distance between pattern edges in the paired measurement regions by detecting a shape of the pattern edge in each measurement region, respectively, wherein
the control unit is configured to detect a flat portion in an edge profile of the pattern within each measurement region, the edge profile representing the pattern edge with position coordinates of each of measurement points arranged at predetermined intervals, and to define an average position of a plurality of ranges of the detected flat portions as a position of the pattern edge in each measurement region.

2. The pattern measuring apparatus according to claim 1, wherein when no flat portion is detected,
the control unit is configured to calculate an edge characteristic curve by finding a moving average of the edge profile by use of a value obtained by subtracting a predetermined value from a design value of a width of the pattern, the predetermined value being a value by an amount of which the pattern is presumed to be curved when being formed, and
the control unit is configured to define a position of a peak value of the edge characteristic curve as a position of the pattern edge.

3. The pattern measuring apparatus according to claim 1, wherein
the control unit is configured to define y1-y2 as the distance between the edges in a y-axis direction, where: y1 denotes a y-coordinate value of the position of the pattern edge in one of the paired measurement regions; y2 denotes a y-coordinate value of the position of the pattern edge in the other of the paired measurement regions; and y1>y2.

4. The pattern measuring apparatus according to claim 1, wherein
the control unit is configured to define X2-x1 as the distance between the edges in an x-axis direction, where: x1 denotes an x-coordinate value of the position of the pattern edge within one of the paired measurement regions; x2 denotes an x-coordinate value of the position of the pattern edge within the other of the paired measurement regions; and x1<x2.

5. The pattern measuring apparatus according to claim 1, wherein
the control unit is configured to perform a smoothing process on each of the edge profiles, if necessary, in units of a predetermined number of measurement positions, in order to reduce noise, and to detect a shortest distance between the pattern edges in the respective measurement regions by using position coordinates of each of measurement points of each edge after the smoothing process.

6. The pattern measuring apparatus according to claim 1, wherein
when the edge has the flat portion and the flat portion is in parallel with an x-axis,
the control unit is configured to calculate an x-coordinate value of a center location of the edge by finding an moving average of the edge profile by use of a moving average width longer than the flat portion of the edge,
the control unit is further configured to calculate an average value of y-coordinate values of the edge profile, the y-coordinate values within a predetermined range around the x-coordinate value, and
the control unit is further configured to calculate the position of the edge pattern in the measurement region.

7. A pattern measuring method for a pattern measuring apparatus including: an electron irradiating unit for radiating an electron beam onto a sample while scanning; an image data acquiring unit for acquiring an image of a pattern on the basis of an amount of electrons generated from the sample where the pattern is formed, by the radiation of the electron beam; and a measurement region setting unit for setting paired measurement regions each including a pattern edge in the image of the pattern, the pattern measuring method comprising the steps of:

acquiring images of patterns in the measurement regions, respectively;
detecting edge profiles in the measurement regions, respectively, each edge profile representing a pattern edge with position coordinates of each of measurement points arranged in predetermined intervals;
detecting flat portions in the edge profiles, respectively;
determining positions of the pattern edges by calculating average positions of the flat portions, respectively; and
detecting a distance between the paired pattern edges in the paired measurement regions.

8. The pattern measuring method according to claim 7, wherein when no flat portion is detected,
the step of detecting flat portions and the step of determining positions of the pattern edges are: a step of calculating an edge characteristic curve by finding a moving average of the edge profile by use of a value obtained by subtracting a predetermined value from a design value of a width of the pattern, the predetermined value being a value by an amount of which the pattern is presumed to be curved when being formed; and a step of determining a position of a peak value of the edge characteristic curve as a position of the pattern edge.

9. The pattern measuring method according to claim 7, wherein
the step of detecting the distance between the edges is a step of y1-y2 as the distance between the edges in a y-axis direction, where: y1 denotes a y-coordinate value of the position of the pattern edge in one of the paired measurement regions; y2 denotes a y-coordinate value of the position of the pattern edge in the other of the paired measurement regions; and y1>y2.

10. The pattern measuring method according to claim 7, wherein
the step of detecting the distance between the edges is a step of defining x2-x1 as the distance between the edges in an x-axis direction, where: x1 denotes an x-coordinate value of the position of the pattern edge within one of the paired measurement regions; x2 denotes an x-coordinate value of the position of the pattern edge within the other of the paired measurement regions; and x1<x2.

11. The pattern measuring method according to claim 7, wherein
the step of detecting the distance between the edges comprises the steps of:
smoothing the edge profile by averaging the edge profile in units of a predetermined number of measurement points; and
detecting a shortest distance between the pattern edges in the paired measurement regions by use of position coordinates of each of the measurement points of the smoothed pattern edge in each of the paired measurement regions.

12. The pattern measuring method according to claim 8, wherein when the edge has the flat portion and the flat portion is in parallel with an x-axis,
the step of calculating the edge characteristic curve and the step of determining positions of the pattern edges are:
a step of calculating an x-coordinate value of a center location of the edge by finding an moving average of the edge profile by use of a moving average width longer than the flat portion of the edge; and
a step of calculating an average value of y-coordinate values of the edge profile within a predetermined range corresponding to the x-coordinate value, and thereby calculating the position of the pattern edge in the measurement region.

* * * * *